United States Patent
Yamada et al.

(10) Patent No.: US 7,567,330 B2
(45) Date of Patent: Jul. 28, 2009

(54) ELECTRO-OPTICAL DEVICE AND ELECTRONIC APPARATUS

(75) Inventors: Kazuyuki Yamada, Nagano (JP); Yasuhito Aruga, Nagano (JP)

(73) Assignee: Seiko Epson Corporation (JP)

( * ) Notice: Subject to any disclaimer, the term of this patent is extended or adjusted under 35 U.S.C. 154(b) by 609 days.

(21) Appl. No.: 11/211,020

(22) Filed: Aug. 24, 2005

(65) Prior Publication Data

US 2006/0044504 A1    Mar. 2, 2006

(30) Foreign Application Priority Data

Sep. 1, 2004    (JP)    .............................. 2004-253838

(51) Int. Cl.
*G02F 1/1345*    (2006.01)
(52) U.S. Cl. ...................................................... 349/149
(58) Field of Classification Search ......... 349/149–152, 349/147, 138, 139
See application file for complete search history.

(56) References Cited

U.S. PATENT DOCUMENTS 6,700,636 B2 *    3/2004    Kim et al. .................... 349/139
7,092,061 B2 *    8/2006    Hong ........................ 349/149

FOREIGN PATENT DOCUMENTS

| JP | 09-311341 | 12/1997 |
| JP | 2002-169490 | 6/2002 |
| JP | 2002-328620 | 11/2002 |
| JP | 2003-216055 | 7/2003 |
| JP | 2003-241224 | 8/2003 |
| JP | 2003-255381 | 9/2003 |

* cited by examiner

*Primary Examiner*—Thoi V Duong
(74) *Attorney, Agent, or Firm*—Harness, Dickey & Pierce, P.L.C.

(57) ABSTRACT

An electro-optical device includes a substrate having a display region; and an extending region extending from the display region. The extending region is provided with wiring lines, and at least some wiring lines, which are disposed to be adjacent to each other, are correspondingly disposed in a plurality of different layers.

2 Claims, 5 Drawing Sheets

ELECTRO-OPTICAL DEVICE AND ELECTRONIC APPARATUS

This application claims priority to Japanese Patent Application No. 2004-253838 filed Sep. 1, 2004 which is hereby expressly incorporated by reference herein in its entirety.

BACKGROUND OF THE INVENTION

1. Technical Field

The present invention relates to an electro-optical device and to an electronic apparatus using the same. In particular, the invention relates to an electro-optical device in which adjacent wiring lines, among wiring lines which deliver power and signals required to drive a display panel, can be reliably insulated from each other in an extending region which does not overlap a counter substrate on an insulating substrate, in a display panel structure having an electro-optical material, such as liquid crystal, between the insulating substrate and the counter substrate, and to an electronic apparatus using the same.

2. Related Art

In an electro-optical device, such as a liquid crystal display device, an electroluminescent (EL) device, and a plasma display device, a chip-on-glass (hereinafter, referred to as 'COG') mounting method, in which integrated circuits (ICs) for driving a display panel are mounted in a mounting area on the insulating substrate constituting the electro-optical device, is usually employed. In the COG mounting method, power or video signal data is input/output to/from a driving IC through wiring lines formed in the mounting area on the insulating substrate. Further, even in a case in which the COG mounting method is not used, for example, in a case in which the driving IC is provided on the insulating substrate by a semiconductor manufacturing process, the input/output of the power or video signal data to/from the driving IC is performed through the conductive wiring lines formed in the mounting area on the insulating substrate.

In a liquid crystal display device in the related art, in order to reduce resistance values of internal wiring lines through which video signals and power are supplied to the driving IC mounted by the COG method or in order to ensure sufficient insulation between the wiring lines, conductive layers located at different positions in a multilayered structure are used, or internal wiring lines for supplying the signals therethrough and internal wiring lines for supplying the power therethrough are formed in different conductive layers with an insulating layer interposed therebetween (for example, see Japanese Unexamined Patent Application Publication No. 2003-255381).

However, the display panel has a problem in that, as the display panel in the electro-optical device has a higher definition, the distance between the wiring lines becomes narrower, so that it becomes difficult to ensure that the insulation between the wiring lines is sufficient.

Japanese Unexamined Patent Application Publication No. 2003-255381 discloses a structure in which the internal wiring lines for supplying the signals therethrough and the internal wiring lines for supplying the power therethrough are formed in different layers with the insulating layer interposed therebetween, in order to ensure sufficient insulation between the wiring lines; however, the insulation between adjacent wiring lines, such as adjacent source lines or adjacent gate lines, is not considered at all, even though the pitch between the adjacent source lines or the pitch between the adjacent gate lines should be as narrow as possible.

SUMMARY

An advantage of the invention is that it provides an electro-optical device and an electronic apparatus capable of reliably insulating adjacent wiring lines from each other even when a display panel has a higher definition thereby increasing the wiring line density.

According to an aspect of the invention, an electro-optical device includes a substrate having a display region; and an extending region extending from the display region. The extending region is provided with wiring lines, and at least some wiring lines, which are disposed to be adjacent to each other, are correspondingly disposed in a plurality of different layers.

According to the above-mentioned structure of the invention, in the extending region where two substrates do not overlap each other, one substrate being located at the display side and the other substrate being located at the bottom side, it is possible to reliably insulate adjacent source lines or adjacent gate lines from each other, even though the pitch between the adjacent source lines or the adjacent gate lines should be as narrow as possible.

Further, in the invention, it is preferable that the wiring lines be signal lines.

According to the above-mentioned structure of the invention, since the number of signal lines, such as a gate line or a source line, increases to make the pitch between the signal lines narrow as the display panel has a higher definition, signal lines adjacent to each other are disposed in two layers, thereby being able to effectively insulate the signal lines from each other.

In addition, when the signals lines except power lines are closely disposed, crosstalk is apt to occur. Even in this case, by disposing the signal lines adjacent to each other in two layers, the insulation between the layers can be further sufficiently ensured or the distance between the signal lines can increase, which is effective to prevent crosstalk between the signal lines from occurring.

Furthermore, in the invention, it is preferable that the wiring lines be at least either some of input-side wiring lines or some of output-side wiring lines provided in a chip on glass (COG).

According to the above-mentioned structure of the invention, when the COG is an IC for driving the display panel, especially the pitch between input lines for the input to the IC and the pitch between the output lines for the output from the IC are apt to be narrow, and therefore, by disposing the input lines and output lines in two layers, the insulation between the input lines and the insulation between the output lines can be further sufficiently ensured, and crosstalk therebetween can be effectively prevented from occurring.

Moreover, in the invention, it is preferable that one end of each of the wiring lines be connected to a substrate for an external input.

According to the above-mentioned structure of the invention, the wiring line density in the extending region is significantly affected by the wiring line density in an output end of a substrate used as an interface for external input (that is, substrate for external input). On the other hand, in reality, the substrate for external input should increase the wiring line density to save space and manufacturing cost. Accordingly, even though the wiring line density in the extending region tends to increase due to an effect of high definition, by disposing at least some of the wiring lines adjacent to each other in two layers in the invention, it is possible to further sufficiently ensure the insulation between the adjacent wiring lines and to prevent crosstalk therebetween from occurring even when the wiring line density increases.

Further, according to another aspect of the invention, an electronic apparatus includes the above-mentioned electro-optical device as a display unit.

In the invention, it is possible to realize an electronic apparatus, having high reliability, in which wiring lines can be effectively insulated from each other.

BRIEF DESCRIPTION OF THE DRAWINGS

The invention will be described with reference to the accompanying drawings, wherein like numbers reference like elements, and wherein.

DESCRIPTION OF THE EMBODIMENTS

The preferred embodiments of the invention will be described with reference to the accompanying drawings.

First Embodiment

Figure 1:
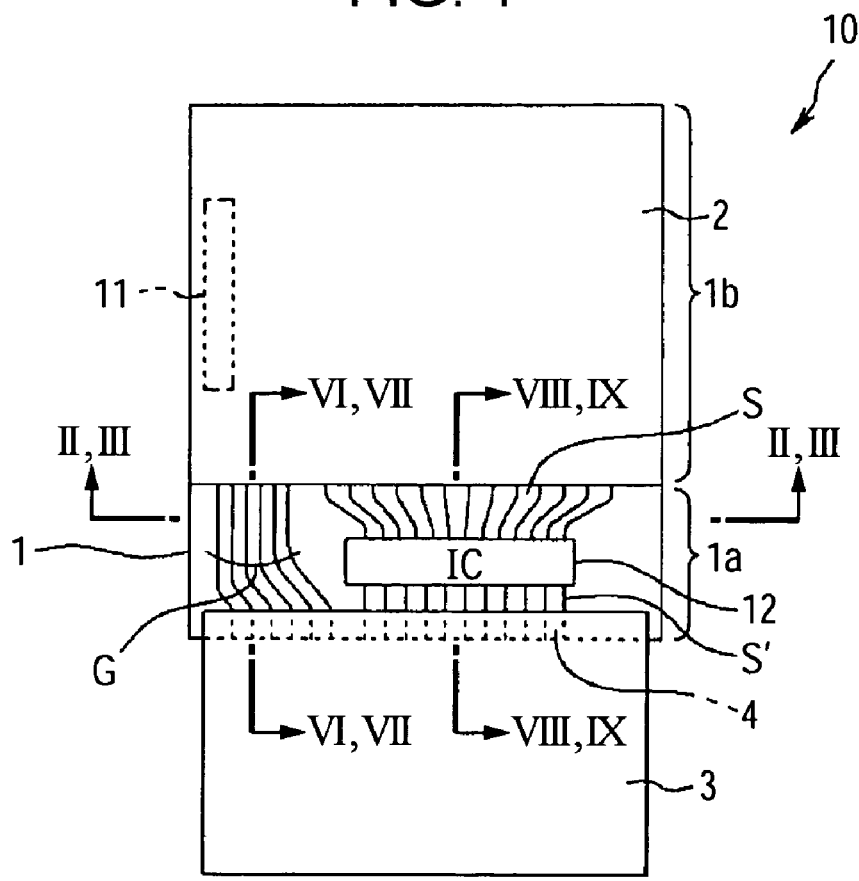
FIG. 1 is a plan view schematically illustrating an electro-optical device according to a first embodiment of the invention.

FIG. 1 is a plan view schematically illustrating an electro-optical device according to a first embodiment of the invention. In the first embodiment, the electro-optical device will be described by using a liquid crystal display device as an example.

The liquid crystal display device includes a thin film transistor (TFT) active-matrix-type liquid crystal display device, a TFT passive-matrix-type liquid crystal display device, a thin film diode (TFD) active-matrix-type liquid crystal display device, or the like.

Referring to FIG. 1, a liquid crystal display device 10 includes a TFT array substrate 1, a counter substrate 2, and a flexible printed board 3 electrically connected to wiring lines in an extending region 1a of the TFT array substrate 1.

The TFT array substrate 1 has an insulating substrate formed of an insulating member, such as glass. Further, on the TFT array substrate 1, TFTs or gate lines G and source lines S and S' of the respective TFTs are formed, and a gate driver 11 and a source driver 12 are provided.

The counter substrate 2 faces the TFT array substrate 1 with liquid crystal interposed therebetween. The counter substrate 2 does not face an entire surface of the TFT array substrate 1, but a portion of the TFT array substrate 1 extends from the counter substrate 2 to form the extending region 1a.

In the present embodiment, the gate driver 11 is formed on the TFT array substrate 1, and the gate line G at an input side of the gate driver 11 includes a wiring line for supplying a scan control signal and a power supplying line for supplying the power to the gate driver 11. Further, the source driver 12 is composed of a driving IC chip, and input-side electrodes (not shown) and output-side electrodes (not shown) located at the bottom side of the IC chip are respectively connected to input-side source lines S' and output-side source lines S by means of an anisotropic conductive sheet (ACF). The source lines S' are input-side wiring lines of the source driver 12, and include a video signal wiring line for supplying video signals and a power supplying wiring line for supplying the power to the source driver 12. The source lines S are output-side wiring lines of the source driver 12 and form signal lines each supplying a driving signal to a source of each TFT (not shown) which drives each of a plurality of liquid crystal pixels located in a display region 1b.

The TFT array substrate 1 has two regions, that is, the display region 1b in which the TFTs (not shown) or the gate driver 11 and gate lines are formed and which faces the counter substrate 2, and the extending region 1a in which a terminal electrode section 4 electrically connected to a terminal section of the wiring lines on the flexible printed board 3, the source driver 12, and the source lines S' and S are formed.

In the extending region 1a constituting a portion of the TFT array substrate 2, the terminal electrode section 4 or the source driver 12 is formed on the surface thereof, and the gate lines G and the source lines S' and S constituting the input/output wiring lines of the source driver 12 are formed in the inner part thereof.

Figure 2:
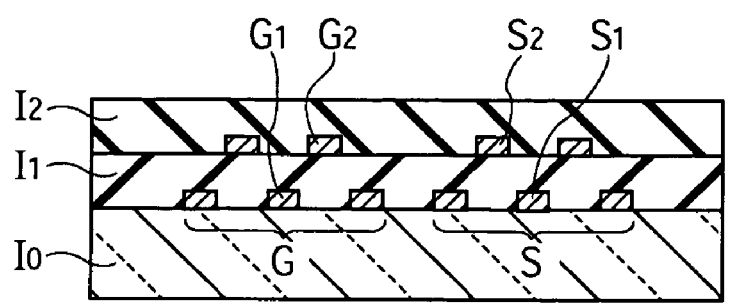
FIG. 2 is a cross-sectional view taken along the line II-II of FIG. 1.

FIG. 2 is a cross-sectional view taken along the line II-II of FIG. 1.

Referring to FIG. 2, gate lines $G_1$ and source lines $S_1$ are formed on the insulating substrate $I_0$ (e.g., glass substrate) constituting the TFT array substrate 1, a first insulating layer $I_1$ is formed thereon, gate lines $G_2$ and source lines $S_2$ are formed on the first insulating layer $I_1$, and a second insulating layer $I_2$ is formed thereon.

According to the first embodiment of the invention, adjacent gate lines G are formed alternately between the first and second insulating layers $I_1$ and $I_2$, and adjacent source lines S at the output side of the source driver 12 are also formed alternately between the first and second insulating layers $I_1$ and $I_2$. As such, the adjacent source lines S and the adjacent gate lines G are disposed alternately between the first and second insulating layers $I_1$ and $I_2$, so that the gate lines G can be reliably insulated from each other, and the output-side source lines S of the source driver 12 can also be reliably insulated from each other and crosstalk between the signal lines can be prevented from occurring. The input-side source lines of the source driver 12 will be described later with reference to FIGS. 4 and 5.

Figure 3A:
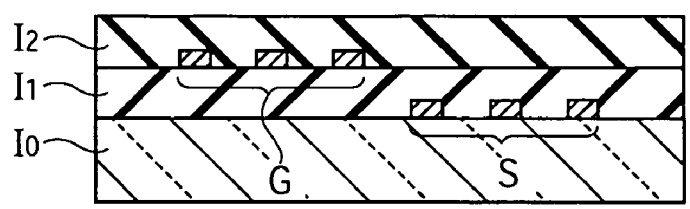
FIG. 3A is a cross-sectional view illustrating the related art.
Figure 3B:
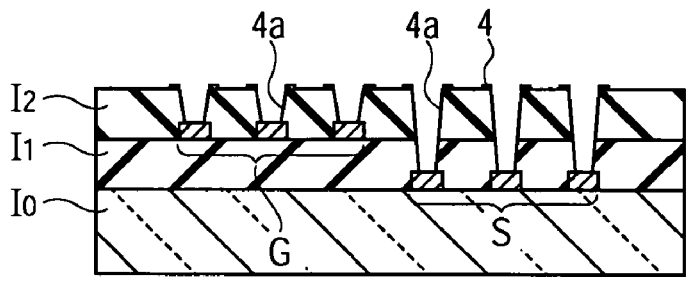
FIG. 3B is a cross-sectional view illustrating the related art.

The structure shown in FIG. 2 is compared with a multi-layer structure with wiring lines in the related art. FIG. 3 illustrates the related art. FIG. 3A is a cross-sectional view taken along the line III-III of FIG. 1, and FIG. 3B is a cross-sectional view taken along the arrayed direction of wiring lines at the terminal electrode section 4 of FIG. 1. As shown in FIGS. 3A and 3B, only source lines S are formed on a glass substrate $I_0$, a first insulating layer $I_1$ is formed thereon, gate lines G are formed on the first insulating layer $I_1$, and a second insulating layer $I_2$ is formed thereon, thereby constituting a two-layer structure. Further, contact holes 4a are formed such that each of the contact holes 4a penetrates only the second insulating layer $I_2$ or penetrates both the first and second insulating layers $I_1$ and $I_2$. Also, the terminal electrodes 4 are formed on the surface of the second insulating layer $I_2$. The terminal electrodes 4 on the surface of the second insulating layer $I_2$ are electrically connected to the corresponding internal source lines S' and the corresponding gate lines G via the contact holes 4a.

Figure 4:
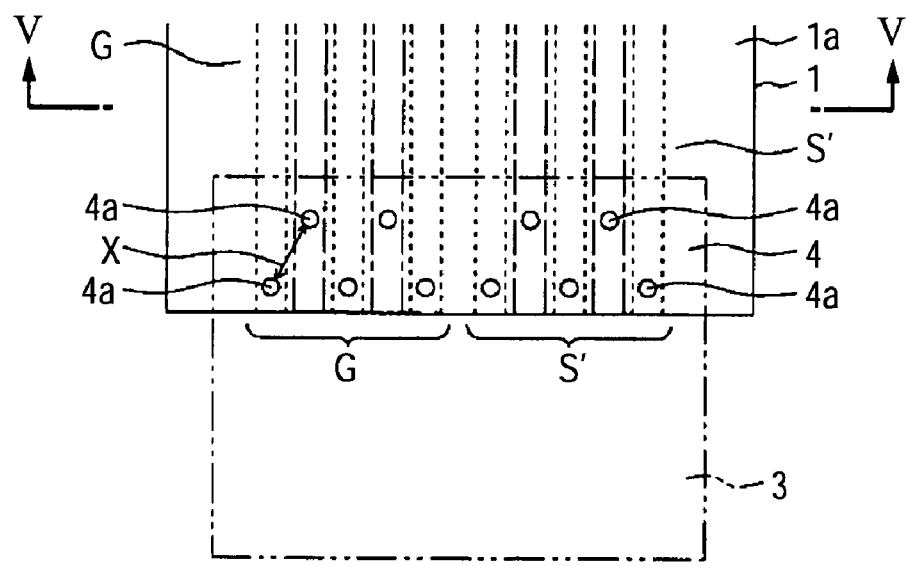
FIG. 4 is an enlarged plan view illustrating input-side wiring lines of a source driver and gate lines in the extending region of FIG. 1.
Figure 5:
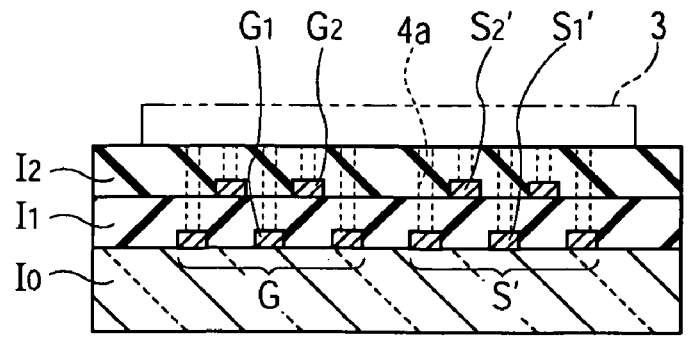
FIG. 5 is a cross-sectional view taken along the line V-V of FIG. 4.

FIG. 4 is an enlarged plan view illustrating the input-side wiring lines of the source driver 12 and gate lines in the extending region 1a of FIG. 1, and FIG. 5 is a cross-sectional view taken along the line V-V of FIG. 4.

Referring to the plan view shown in FIG. 4, the terminal electrode sections 4, which are located at ends of the gate lines G and the source lines S', are electrically connected one-to-one to the terminal sections of the wiring lines (not shown) in the flexible printed board 3. The source lines S' and the gate lines G are respectively disposed to be adjacent to each other to have a narrow pitch in plan view from above. However, as is apparent from FIG. 5, the source lines S' are disposed alternately between the first and second insulating layers $I_1$ and $I_2$ such that the adjacent source lines S' are disposed every other layer and the gate lines G are also disposed alternately between the first and second insulating layers $I_1$ and $I_2$ such that the adjacent gate lines G are disposed every other layer. As a result, even at the input side of the source driver 12, the adjacent wiring lines can be reliably insulated from each other and crosstalk between the wiring lines can be prevented from occurring, in the same manner as at the output side of the source driver 12 (see FIG. 2). In addition, as shown in FIG. 4, the contact holes 4a formed in the terminal electrode sections 4 of the corresponding source lines S' and the corresponding gate lines G are alternately formed such that the adjacent contact holes 4a are disposed at different positions along the direction in which the wiring lines are arranged. As described above, the terminal electrode sections 4 are formed on the corresponding contact holes 4a, that is, on the surface of the second insulating layer $I_2$. Accordingly, the distance between adjacent terminal electrodes becomes approximately equal to a distance x between the contact holes 4a, so that the distance x becomes larger than that in a case in which the contact holes are formed such that adjacent contact holes are arranged in a straight line, thereby further ensuring sufficient insulation between adjacent terminal electrodes.

Figure 6:
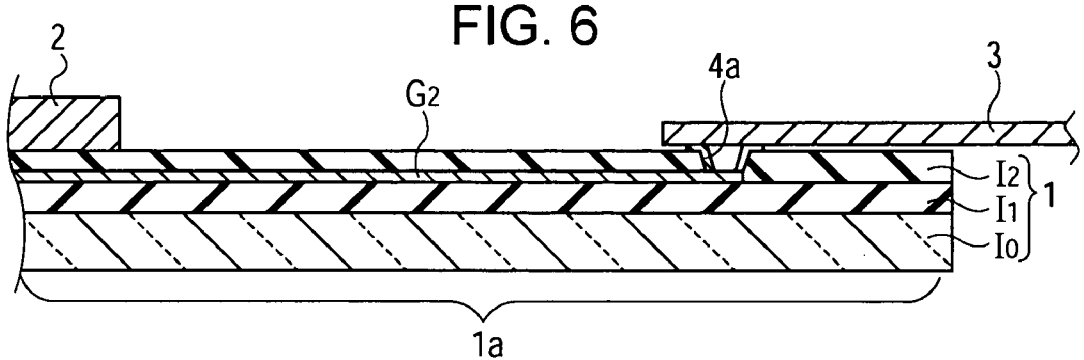
FIG. 6 is a view illustrating a cross section of an example of a gate line (G) region in the extending region taken along the line VI-VI of FIG. 1.
Figure 7:
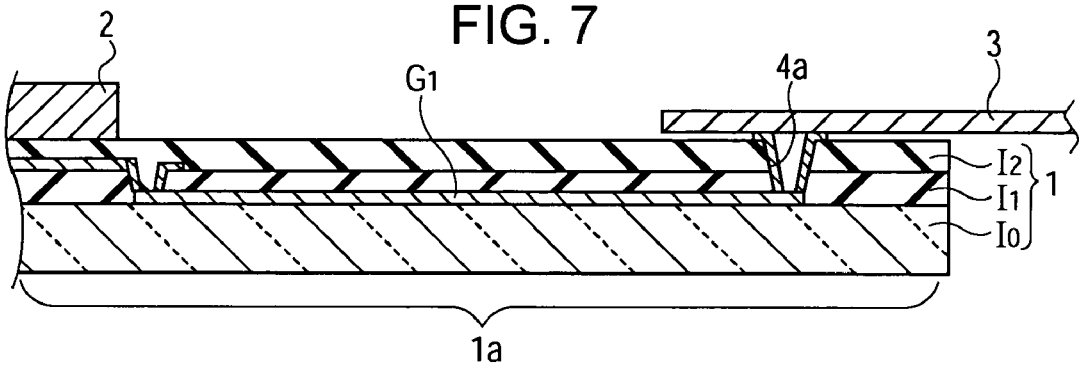
FIG. 7 is a view illustrating another example of the cross section of the gate line (G) region in the extending region taken along the line VII-VII of FIG. 1.

FIGS. 6 and 7 illustrate cross-sectional views of the gate line G region in the extending region 1a taken along the lines VI-VI and VII-VII of FIG. 1, respectively. FIG. 6 illustrates a cross-sectional view of the gate line $G_2$ (see FIGS. 2 and 5) which is formed in the second insulating layer $I_2$ of the gate line G region taken along the line VI-VI of FIG. 1, and FIG. 7 illustrates a cross-sectional view of the gate line $G_1$ (see FIGS. 2 and 5) which is formed in the first insulating layer $I_1$ of the gate line G region taken along the line VII-VII of FIG. 1.

Figure 8:
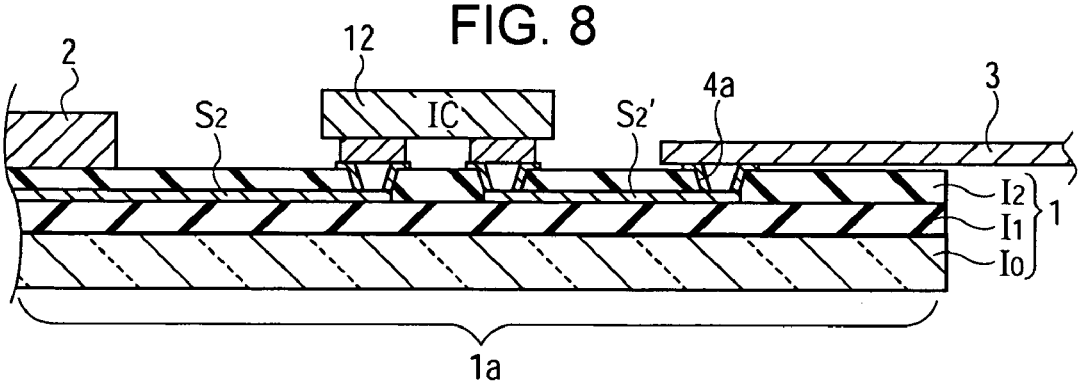
FIG. 8 is a view illustrating an example of the cross section of the source line (S, S') region in the extending region taken along the line VIII-VIII of FIG. 1.
Figure 9:
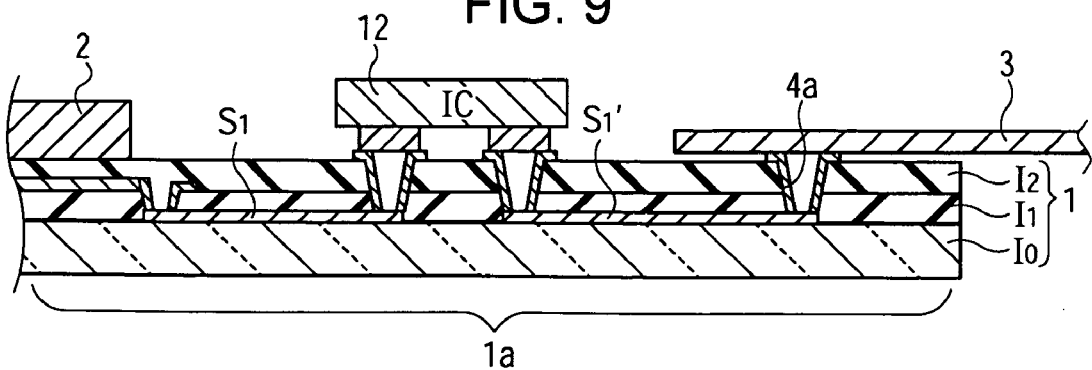
FIG. 9 is a view illustrating another example of the cross section of the source line (S, S') region in the extending region taken along the line IX-IX of FIG. 1.

FIGS. 8 and 9 illustrate cross-sectional views of the source lines S and S' region in the extending region 1a taken along the lines VIII-VIII and IX-IX of FIG. 1, respectively. This corresponds to a case in which a driving IC mounted by the COG method exists. FIG. 8 illustrates a cross-sectional view of the source lines $S_2$ and $S_2$' (see FIGS. 2 and 5) which are formed within the second insulating layer $I_2$ in the source lines S and S' region taken along the line VIII-VIII of FIG. 1, and FIG. 9 illustrates a cross-sectional view of the source lines $S_1$ and $S_1$' (see FIGS. 2 and 5) which is formed within the first insulating layer $I_1$ in the source lines S and S' region taken along the line IX-IX of FIG. 1.

Second Embodiment

Next, a second embodiment of the invention will be described through a case in which adjacent wiring lines are disposed in a two-layer structure as in the first embodiment, but overlap each other in an up and down direction.

Figure 10:
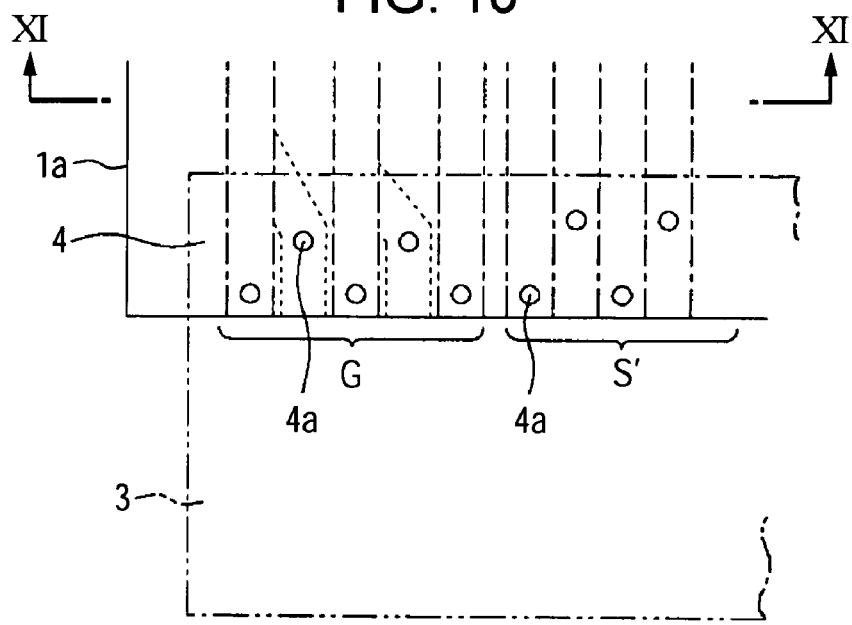
FIG. 10 is an enlarged view illustrating some of the gate lines and some of the input-side wiring lines of the source driver in the extending region of FIG. 1, according to the second embodiment of the invention.

FIG. 10 is an enlarged plan view illustrating some of the gate lines and some of the input-side wiring lines of the source driver 12 in the extending region 1a of FIG. 1, according to the second embodiment of the invention. In addition, FIG. 11 illustrates a cross-sectional view taken along the line XI-XI of FIG. 10.

Figure 11:
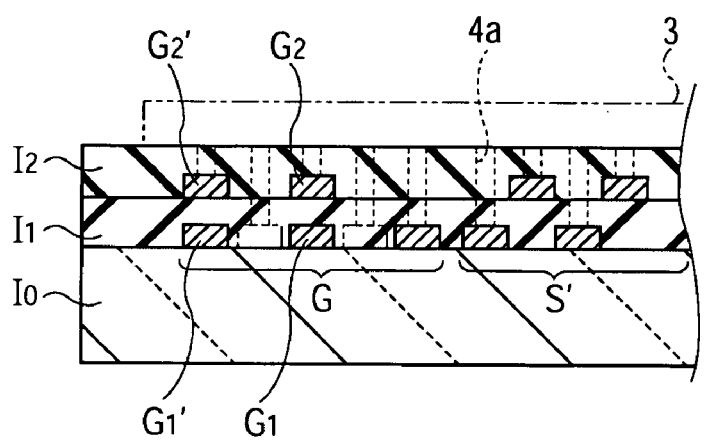
FIG. 11 is a cross-sectional view taken along the line XI-XI of FIG. 10.

As shown in FIG. 11, the gate line $G_1$ in the first insulating layer $I_1$ and the gate line $G_2$ in the second insulating layer $I_2$ are disposed to overlap in the up and down direction (that is, in a vertical direction), and the gate line $G_1$' in the first insulating layer $I_1$ and the gate line $G_2$' in the second insulating layer $I_2$ are disposed to overlap in the up and down direction. As such, although they are disposed to overlap each other in the up and down direction, the adjacent wiring lines are disposed in the upper and lower insulating layers $I_1$ and $I_2$, respectively, so that the wiring lines can be reliably insulated from each other.

As such, a method of forming terminal electrode sections in the end of the extending region 1a when the wiring lines are disposed to overlap each other in the up and down direction is, for example, as follows. As shown in FIG. 10, wiring lines in the first insulating layer $I_1$, which is located below second insulating layer $I_2$, are bent in a region where the terminal electrode sections are formed (shown by dotted lines), the wiring line pattern in the first insulating layer $I_1$ being designed such that the positions of the wiring lines in the first insulating layer $I_1$ are different from the positions of the wiring lines in the second insulating layer $I_2$, which is located above the first insulating layer $I_1$, and the contact holes 4a are formed in the wiring lines (dotted lines) whose positions are different from the positions of the wiring lines in the second insulating layer $I_2$, thereby forming the terminal electrode sections 4. Even in this case, the positions of the contact holes 4a are also determined to be different from those of the adjacent wiring lines with respect to the direction in which the wiring lines are arranged, thereby further sufficiently ensuring the insulation between adjacent terminal electrodes.

Further, as shown in FIG. 10, the adjacent source lines S' are arranged with no gap therebetween in plan view. Even in this case, as shown in FIG. 11, since the contact holes 4a are correspondingly formed in the source lines S', and the contact holes 4a are alternately formed such that the adjacent contact holes 4a are disposed at different positions along the direction in which the wiring lines are arranged, thereby further sufficiently ensuring the insulation between the adjacent terminal electrodes.

Third Embodiment

Figure 12:
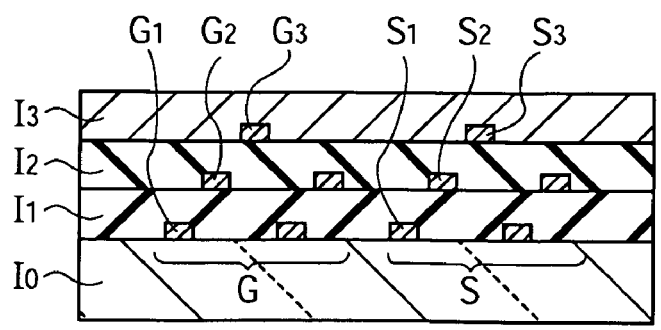
FIG. 12 is a cross-sectional view illustrating a three-layer structure of output-side wiring lines of the source driver and the gate lines in the extending region of FIG. 1, according to a third embodiment of the invention.

FIG. 12 is a cross-sectional view illustrating a three-layer structure of output-side wiring lines of the source driver 12 and the gate lines in the extending region 1a of FIG. 1, according to a third embodiment of the invention.

Referring to FIG. 12, a gate line $G_1$ and a source line $S_1$ are formed on the insulating substrate $I_0$ (e.g., glass substrate) constituting the TFT array substrate 1, a first insulating layer $I_1$ is formed thereon, a gate line $G_2$ and a source line $S_2$ are formed on the first insulating layer $I_1$, a second insulating layer $I_2$ is formed thereon, and a gate line $G_3$ and a source line $S_3$ are formed on the second insulating layer $I_2$, and a third insulating layer $I_3$ is formed thereon.

According to the third embodiment, adjacent gate lines G are formed alternately among the first, second, and third insulating layers $I_1$, $I_2$, and $I_3$, respectively, and adjacent source lines S at the output side of the source driver 12 are also formed alternately among the first, second, and third insulating layers $I_1$, $I_2$, and $I_3$, respectively. As such, by disposing the adjacent source lines S and the adjacent gate lines G alternately among the first, second, and third insulating layers $I_1$, $I_2$, and $I_3$, respectively, the insulation between the gate lines G and the insulation between the output-side source lines S of the source driver 12 can be sufficiently ensured without increasing the area of a substrate and crosstalk between the signal lines can be prevented from occurring, even when the number of gate lines G and the number of source lines S significantly increase as the liquid crystal display device has a higher definition.

Also in the case in which the input-side source lines S' of the source driver 12 have a three-layer structure, even though one layer is added to the two-layer structure shown in FIGS. 4 and 5, the contact holes 4a are respectively formed toward the surface of the substrate such that the adjacent contact holes 4a are disposed alternately between the adjacent wiring lines along the linear (longitudinal) directions of the wiring lines in each of the three layers, and thus it is possible to keep a necessary gap between the adjacent terminal electrodes and to further sufficiently ensure the insulation therebetween.

Figure 13A:
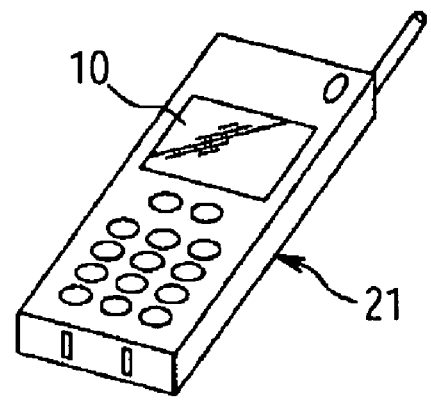
FIG. 13A is a view illustrating an appearance of an electronic apparatus using an electro-optical device.
Figure 13B:
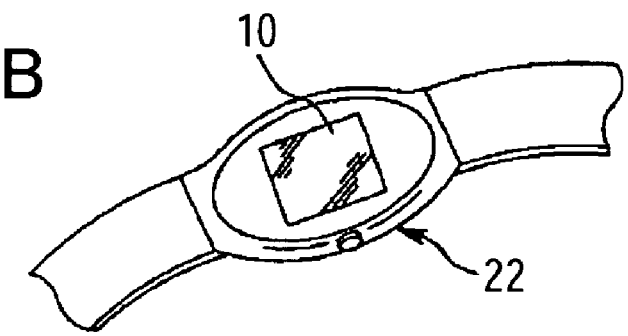
FIG. 13B is a view illustrating an appearance of an electronic apparatus using an electro-optical device.
Figure 13C:
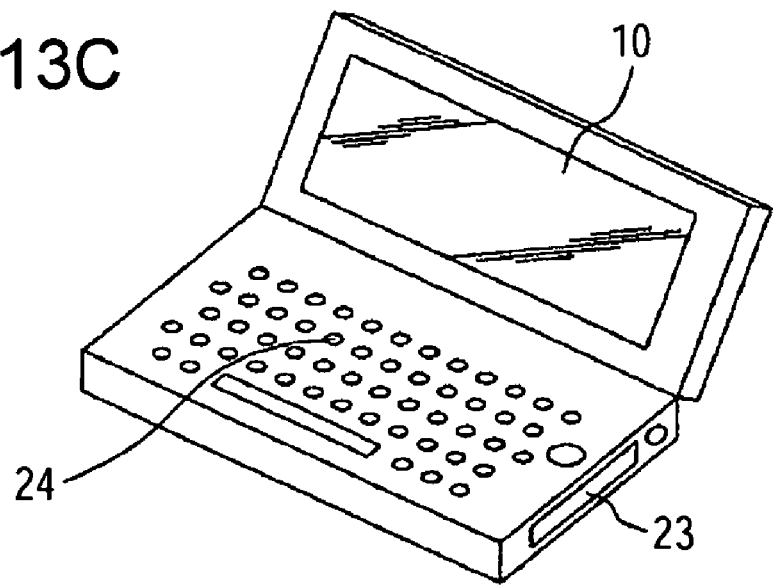
FIG. 13C is a view illustrating an appearance of an electronic apparatus using an electro-optical device.

FIGS. 13A to 13C are views illustrating appearances of electronic apparatuses each using a liquid crystal display device 10, respectively.

FIG. 13A illustrates a mobile phone 21 in which the liquid crystal display device 10, serving as a display unit, is provided on an upper part of a front surface thereof. FIG. 13B illustrates a wristwatch 22 in which a display unit using the liquid crystal display device 10 is provided at a center of a front surface of its main body. FIG. 13C illustrates a portable digital assistant 23, which has a display unit composed of the liquid crystal display device 10 and an input unit 24. Such electronic apparatuses, although not shown except the liquid crystal display device 10, may include several circuits, such as a displayed information output source, a displayed information processing circuit, a clock generation circuit, or a display signal generation unit composed of a power circuit for supplying power to those circuits and the like. To the display unit, for example, in a case of the portable digital assistant, display signals generated by the display signal generation unit are supplied based on the information input from the input unit 24, thereby forming display images.

Further, in addition to the mobile phone, the wristwatch, and the portable digital assistant, various electronic apparatuses, such as a notebook computer, an electronic note, an electronic calculator, a point of sale (POS) terminal, a mini disk player, may be considered as the electronic apparatus into which the liquid crystal display device 10 of the embodiments is assembled.

The invention is not limited to the liquid crystal display device, but may be widely applied to an electro-optical device using an electro-optical material, such as an EL device or a plasma display device, and an electronic apparatus using the same.

What is claimed is:

1. An electro-optical device comprising:
   a first substrate;
   a second substrate including a display region and an extending region extending from the display region, the display region overlapping the first substrate in plan view and the extending region being in a non-overlapping condition with the first substrate in plan view;
   a third substrate connected to the extending region of the second substrate;
   a plurality of first wiring lines each extending over the extending region in an extending direction;
   a first insulation layer over the plurality of first wiring lines;
   a plurality of second wiring lines each extending over the first insulation layer in the extending direction, each of the plurality of second wiring lines being in a non-overlapping condition with each of the plurality of first wiring lines in the extending region in plan view;
   a second insulation layer over the plurality of second wiring lines;
   a plurality of first contact holes through the first insulation layer and the second insulation layer, the plurality of first contact holes connecting respective ones of the first wiring lines with the third substrate; and
   a plurality of second contact holes through the second insulation layer, the plurality of second contact holes connecting respective ones of the second wiring lines with the third substrate, the plurality of second contact holes each being shifted away from each of the plurality of first contact holes in the extending direction and in a direction perpendicular to the extending direction.

2. The electro-optical device of claim 1, wherein the plurality of first and second wiring lines are divided into a plurality of gate lines and a plurality of source lines, and wherein the plurality of gate lines are spaced as a group apart from the plurality of source lines in a direction perpendicular to the extending direction.

* * * * *